United States Patent
Aratake et al.

(10) Patent No.: US 8,448,311 B2
(45) Date of Patent: May 28, 2013

(54) METHOD OF MANUFACTURING A PIEZOELECTRIC VIBRATOR

(75) Inventors: Kiyoshi Aratake, Chiba (JP); Yasuo Kawada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 383 days.

(21) Appl. No.: 12/860,570

(22) Filed: Aug. 20, 2010

(65) Prior Publication Data

US 2010/0313399 A1    Dec. 16, 2010

Related U.S. Application Data

(63) Continuation of application No. PCT/JP2008/072622, filed on Dec. 12, 2008.

(30) Foreign Application Priority Data

Feb. 21, 2008   (JP) .................................. 2008-039860

(51) Int. Cl.
*H04R 17/10*   (2006.01)

(52) U.S. Cl.
USPC ................... 29/25.35; 156/273.1; 310/348

(58) Field of Classification Search
USPC .............. 29/25.35, 830, 852, 832; 156/272.2, 156/273.1; 310/344, 348, 370
See application file for complete search history.

(56) References Cited

U.S. PATENT DOCUMENTS 5,949,294 A * 9/1999 Kondo et al. ............. 310/348 X
6,018,211 A * 1/2000 Kanaboshi et al. ....... 310/344 X

FOREIGN PATENT DOCUMENTS

| JP | 60134508 A | * | 7/1985 |
| JP | 06-163943 A | | 6/1994 |
| JP | 06-058619 U | | 8/1994 |
| JP | 06-283951 A | | 10/1994 |
| JP | 2002-050939 A | | 2/2002 |
| JP | 2002-319839 A | | 10/2002 |
| JP | 2007-039802 A | | 2/2007 |
| JP | 2007-173915 A | | 7/2007 |
| JP | 2007-267101 A | | 10/2007 |
| JP | 2007-328469 A | | 12/2007 |

OTHER PUBLICATIONS

International Search Report for International Application No. PCT/JP2008/072622, dated Feb. 3, 2009, 2 pages.

* cited by examiner

*Primary Examiner* — A. Dexter Tugbang
(74) *Attorney, Agent, or Firm* — Brinks Hofer Gilson & Lione

(57) ABSTRACT

When a base substrate where through electrodes are formed is anodically bonded to a lid substrate that includes a bonding film formed on the entire lower surface thereof, a method of manufacturing a piezoelectric vibrator includes a superimposing process for superimposing the lid substrate on the base substrate so that a piezoelectric vibrating reed is received in a cavity, after bonding the piezoelectric vibrating reed to the upper surface of the base substrate; a setting process for placing a dummy member, which is made of a material in which ions can be transferred at a bonding temperature, on an electrode plate, and placing the superimposed substrates on the dummy member so that the base substrate faces the dummy member; and an applying process for applying a bonding voltage between the electrode plate and the bonding film after heating the dummy member and the substrates up to the bonding temperature.

2 Claims, 15 Drawing Sheets

METHOD OF MANUFACTURING A PIEZOELECTRIC VIBRATOR

RELATED APPLICATIONS

This application is a continuation of PCT/JP2008/072622 filed on Dec. 12, 2008, which claims priority to Japanese Application No. 2008-039860 filed on Feb. 21, 2008. The entire contents of these applications are incorporated herein by reference.

BACKGROUND OF THE INVENTION

1. Field of the Invention

The present invention relates to a method of manufacturing a surface mounted (SMD) piezoelectric vibrator where a piezoelectric vibrating reed is sealed in a cavity formed between two bonded substrates, a piezoelectric vibrator manufactured by the method, and an oscillator, an electronic device, and a radio clock that each include the piezoelectric vibrator.

2. Description of the Related Art

In recent years, a piezoelectric vibrator, which employs crystal or the like as a time source, a timing source of a control signal or the like, a reference signal source or the like, has been used in a cell phone or a portable information terminal device. Various piezoelectric vibrators have been known as this kind of piezoelectric vibrator, but a surface mounted piezoelectric vibrator has been known as one of the piezoelectric vibrators. As this kind of piezoelectric vibrator, there is generally known a piezoelectric vibrator having a three-layer structure where a piezoelectric substrate including a piezoelectric vibrating reed is bonded to a base substrate and a lid substrate so as to be interposed between the base substrate and the lid substrate in a vertical direction. In this case, the piezoelectric vibrating reed is received in a cavity (closed chamber) that is formed between the base substrate and the lid substrate.

Further, in recent years, there has been developed a piezoelectric vibrator having not a three-layer structure but a two-layer structure. This type of piezoelectric vibrator has a two-layer structure where a base substrate and a lid substrate are directly bonded to each other and a piezoelectric vibrating reed is received in a cavity formed between both the substrates. The two-layer structure type piezoelectric vibrators are superior to three-layer structure type piezoelectric vibrators in terms of the reduction in thickness. Accordingly, the two-layer structure type piezoelectric vibrators are preferably used.

Meanwhile, when the two-layer structure type piezoelectric vibrator is manufactured, the base substrate and the lid substrate are anodically bonded to each other by using a bonding film formed on the lower surface (bonding surface) of the lid substrate. Specifically, after being superimposed, both the substrates are set on an electrode plate of an anodic bonding apparatus. Subsequently, while the base substrate is heated, a voltage is applied between the bonding film and the electrode plate. In this case, since the base substrate is heated, ions in the base substrate have flowability. Accordingly, if a voltage is applied between the bonding film and the electrode plate simultaneously with this, current flows in the base substrate. Therefore, it may be possible to make an electrochemical reaction occur on the interface between the bonding film and the base substrate, and to make the bonding film and the base substrate come into close contact with each other and be anodically bonded to each other.

Meanwhile, as this type of piezoelectric vibrator, there is known a piezoelectric vibrator where a bonding film is formed not only on the bonding surface but also on the entire lower surface of a lid substrate (for example, Patent Citation 1). One example of this piezoelectric vibrator will be briefly described with reference to drawings. As shown in FIGS. 18 and 19, a piezoelectric vibrator 200 includes a base substrate 201 and a lid substrate 202 that are bonded to each other, and a piezoelectric vibrating reed 203 that is sealed in a cavity C formed between both the substrates 201 and 202. The piezoelectric vibrating reed 203 is, for example, a tuning-fork type vibrating reed, and is mounted on the upper surface of the base substrate 201 in the cavity C.

Each of the base substrate 201 and the lid substrate 202 is, for example, a glass substrate. Through holes 204, which pass through the substrate 201, are formed at the base substrate 201 of both the substrates 201 and 202. Further, a conductive member is fitted to each of the through holes 204 so as to close the through hole 204, so that a through electrode 205 is formed. The through electrodes 205 are electrically connected to an external electrode 206 formed on the lower surface of the base substrate 201, and are electrically connected to the piezoelectric vibrating reed 203 mounted in the cavity C. Further, a bonding film 207 is formed on the entire lower surface of the lid substrate 202, and both the substrates 201 and 202 are anodically bonded to each other by using the bonding film 207.

Patent Citation 1: JP-A-6-283951

Meanwhile, there have been the following problems in the anodic bonding used to manufacture the piezoelectric vibrator 200 where the bonding film 207 is formed on the entire lower surface of the lid substrate 202. Specifically, first, the base substrate 201 and the lid substrate 202, which are superimposed, are set on an electrode plate 208 as shown in FIG. 20 at the time of the anodic bonding. Then, a bonding voltage (for example, 0.5 to 5.0 kV) needs to be applied between the bonding film 207 and the electrode plate 208 while all of them are heated to a bonding temperature (for example, 100 to 200° C.).

In this case, the through electrodes 205, which are formed at the base substrate 201, come into direct contact with the electrode plate 208. Accordingly, when the bonding voltage is applied between the bonding film 207 and the electrode plate 208, substantially the same voltage as the bonding voltage might be applied even between the bonding film 207 and the through electrode 205. In particular, the through electrodes 205 are electrically connected to the piezoelectric vibrating reed 203 that is close to the bonding film 207. For this reason, there has been a concern that electric discharge (spark discharge) occurs from the bonding film 207 toward the through electrodes 205 through the piezoelectric vibrating reed 203.

As a result, there has been a problem in that the through electrode 205 having been subjected to electric discharge is melted. For this reason, there has been a possibility that electric conductivity between the piezoelectric vibrating reed 203 and the external electrode 206 becomes unreliable. In addition, if the through electrode 205 is melted, it may not be possible to seal the through hole 204. For this reason, there also has been a possibility that airtightness in the cavity C cannot be secured.

Further, if electric discharge occurs, sufficient current does not flow in the bonding film 207. For this reason, there has been a problem in that anodic bonding between the base substrate 201 and the lid substrate 202 is affected. Therefore, it was not possible to reliably seal both the substrates, and it also was difficult to secure airtightness in the cavity C.

SUMMARY OF THE INVENTION

The invention has been made in consideration of the above-mentioned circumstances, and an object of the invention is to provide a method of manufacturing a high-quality two-layer structure type surface mounted piezoelectric vibrator that secures stable electric conductivity between a piezoelectric vibrating reed and external electrodes and secures airtightness in a cavity by performing anodic bonding after forming a bonding film on the entire lower surface of a lid substrate. Further, there are provided a piezoelectric vibrator that is manufactured by the method, and an oscillator, an electronic device, and a radio clock that each include the piezoelectric vibrator.

The invention provides the following means in order to solve the above-mentioned problems.

According to the invention, there is provided a method of manufacturing a piezoelectric vibrator that includes a base substrate, a lid substrate, a piezoelectric vibrating reed, external electrodes, and through electrodes. The base substrate is made of a glass material. A bonding film is formed on the entire lower surface of the lid substrate, and the lid substrate is made of a glass material and anodically bonded to the base substrate with the bonding film interposed there between so that a cavity is formed between the lid substrate and the base substrate. The piezoelectric vibrating reed is bonded to the upper surface of the base substrate while being received in the cavity. The external electrodes are formed on the lower surface of the base substrate. The through electrodes are formed so as to pass through the base substrate, and electrically connect the piezoelectric vibrating reed to the external electrodes. When the base substrate and the lid substrate are anodically bonded to each other, the method performs a superimposing process for superimposing the lid substrate on the base substrate so that the piezoelectric vibrating reed is received in the cavity, after bonding the piezoelectric vibrating reed to the upper surface of the base substrate where the through electrodes are formed; a setting process for placing a dummy member, which is made of a material in which ions can be transferred at a bonding temperature, on an electrode plate, and placing the superimposed substrates on the dummy member so that the base substrate faces the dummy member; and an applying process for applying a bonding voltage between the electrode plate and the bonding film after heating the dummy member and the substrates up to the bonding temperature.

In the method of manufacturing the piezoelectric vibrators according to the invention, when the base substrate and the lid substrate are anodically bonded to each other, first, there is performed a superimposing process for superimposing the lid substrate on the base substrate after bonding the piezoelectric vibrating reed to the upper surface of the base substrate where the through electrodes are formed. In this case, both the substrates are superimposed so that the piezoelectric vibrating reed is received in the cavity. Subsequently, there is performed a setting process for placing a dummy member on an electrode plate, and placing the superimposed substrates on the dummy member so that the base substrate faces the dummy member. After that, there is performed an applying process for applying a bonding voltage between the electrode plate and the bonding film after heating the dummy member and the substrates up to the bonding temperature. Accordingly, it may be possible to manufacture a two-layer structure type surface mounted piezoelectric vibrator where the base substrate and the lid substrate are anodically bonded to each other.

In particular, a member made of a material in which ions can be transferred at a bonding temperature is used as the dummy member. Accordingly, by heating up to a bonding temperature and applying a driving voltage between the electrode plate and the bonding film by a heating process and the applying process, the transfer of ions (charged particles) locally occurs in the base substrate wafer and the dummy member, which are interposed between the electrode plate and the bonding film. As a result, current flows in the base substrate wafer and the dummy member. In contrast, the bonding film does not come into contact with the through electrodes and the through electrodes are not interposed between the bonding film and the electrode plate. Accordingly, even though a voltage is applied between the bonding film and the electrode plate, the transfer of ions does not occur. In addition, since the dummy member is interposed between the through electrodes and the electrode plate, current does not directly flow from the electrode plate to the through electrodes. That is, even though a bonding voltage is applied between the bonding film and the electrode plate in the applying process, current does not flow in the through electrodes and a potential difference as high as the bonding voltage cannot be generated between the bonding film and the through electrodes. For this reason, it may be possible to suppress the occurrence of electric discharge (spark discharge) that has frequently occurred in the related art between the bonding film and the through electrodes.

Accordingly, it may be possible to prevent the melting of the through electrodes that is caused by electric discharge. Therefore, it may be possible to secure stable electric conductivity between the piezoelectric vibrating reed and the external electrodes, and to secure airtightness in the cavity. As a result, it may be possible to improve the quality of the piezoelectric vibrator.

In addition, it may be possible to sufficiently secure current, which flows in the bonding film and the base substrate, by suppressing electric discharge. Accordingly, it may be possible to make the bonding film and the base substrate come into close contact with each other by anodic bonding, and to secure airtightness even on the bonding surfaces of both the substrates.

Further, since an only simple method, which interposes the dummy member between the base substrate and the electrode plate, is used, it may be possible to use facilities in the related art. Therefore, it may be possible to manufacture the piezoelectric vibrator at low cost.

Moreover, in the method of manufacturing the piezoelectric vibrator according to the invention, a member, which has a coefficient of thermal expansion substantially equal to the coefficient of thermal expansion of the base substrate, may be used as the dummy member.

Furthermore, in the method of manufacturing the piezoelectric vibrator according to the invention, a member, which has a coefficient of thermal expansion substantially equal to the coefficient of thermal expansion of the base substrate, may be used as the dummy member. Accordingly, when being heated in the applying process, the base substrate and the dummy member thermally expand to the same degree. Therefore, there is no concern that the base substrate is partially floated from the dummy member due to the excessive expansion of only one of the base substrate and the dummy member. That is, it may be possible to perform the applying process while the base substrate and the dummy member come into close contact with each other. Accordingly, it may be possible to more reliably perform anodic bonding between the base substrate and the lid substrate, and to further improve the quality of the piezoelectric vibrator.

Further, a piezoelectric vibrator according to the invention is manufactured by the method of manufacturing the piezoelectric vibrator according to the invention.

Since the piezoelectric vibrator according to the invention is manufactured by the method of manufacturing the piezoelectric vibrator according to the invention, it may be possible to manufacture a high-quality piezoelectric vibrator that can reliably maintain airtightness in a cavity and secure stable electric conductivity between a piezoelectric vibrating reed and external electrodes.

Further, according to the invention, there is provided an oscillator where the piezoelectric vibrator according to the invention is electrically connected to an integrated circuit as an oscillating component.

Furthermore, according to the invention, there is provided an electronic device where the piezoelectric vibrator according to invention is electrically connected to a clock unit.

In addition, according to the invention, there is provided a radio clock where the piezoelectric vibrator according to the invention is electrically connected to a filter unit.

The oscillator, the electronic device, and the radio clock according to the invention each include the piezoelectric vibrator having improved quality. Accordingly, likewise, it may be possible to improve the quality of the oscillator, the electronic device, and the radio clock.

According to the method of manufacturing the piezoelectric vibrator of the invention, it may be possible to manufacture a high-quality two-layer structure type surface mounted piezoelectric vibrator that can reliably maintain airtightness in a cavity and secure stable electric conductivity between a piezoelectric vibrating reed and external electrodes.

Since the piezoelectric vibrator according to the invention is manufactured by the above-mentioned method, it may be possible to manufacture a high-quality piezoelectric vibrator.

Further, since the oscillator, the electronic device, and the radio clock each include the above-mentioned piezoelectric vibrator, likewise, it may also be possible to improve the quality of the oscillator, the electronic device, and the radio clock.

DETAILED DESCRIPTION OF THE PREFERRED EMBODIMENTS

Figure 1:
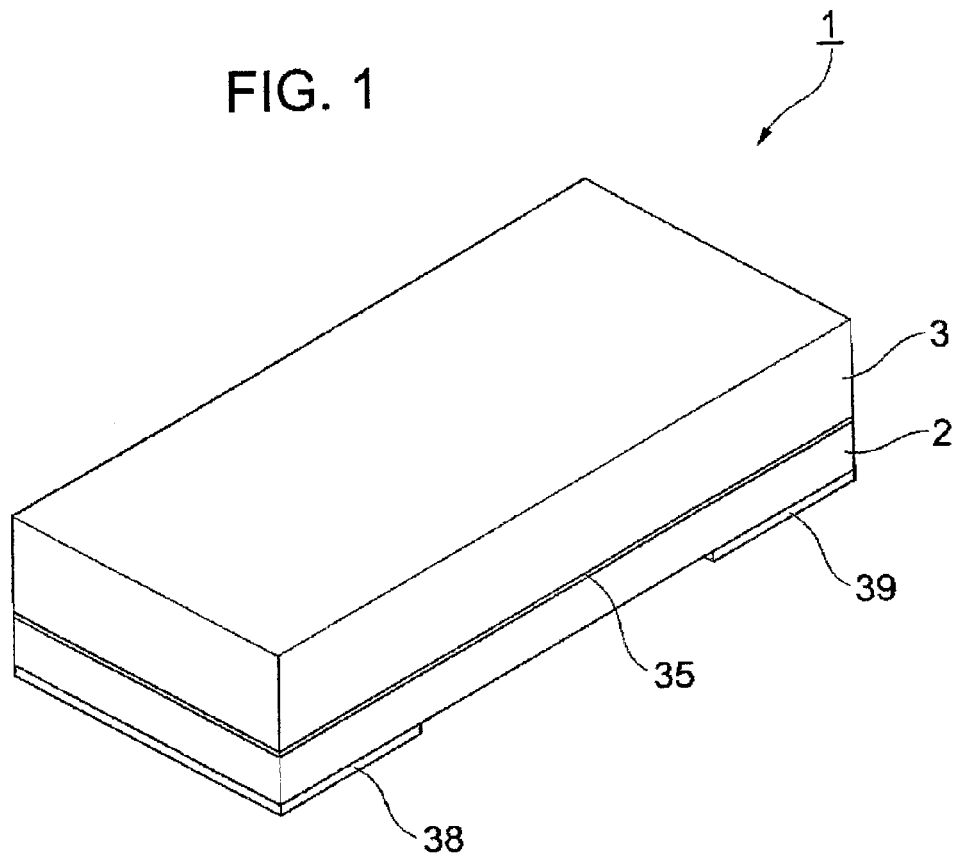
FIG. 1 is a perspective view showing the appearance of an embodiment of a piezoelectric vibrator according to the invention.

An embodiment of the invention will be described below with reference to FIGS. 1 to 14.

As shown in FIGS. 1 to 4, a piezoelectric vibrator 1 according to this embodiment is formed in a box shape where two layers (a base substrate 2 and a lid substrate 3) are laminated, and is a surface mounted piezoelectric vibrator 1 where a piezoelectric vibrating reed 4 is received in an inner cavity C.

Meanwhile, for the easy understanding of drawings, an excitation electrode 15, extraction electrodes 19 and 20, mount electrodes 16 and 17, and a weight metal film 21, which are to be described below, are not shown in FIG. 4.

Figure 5:
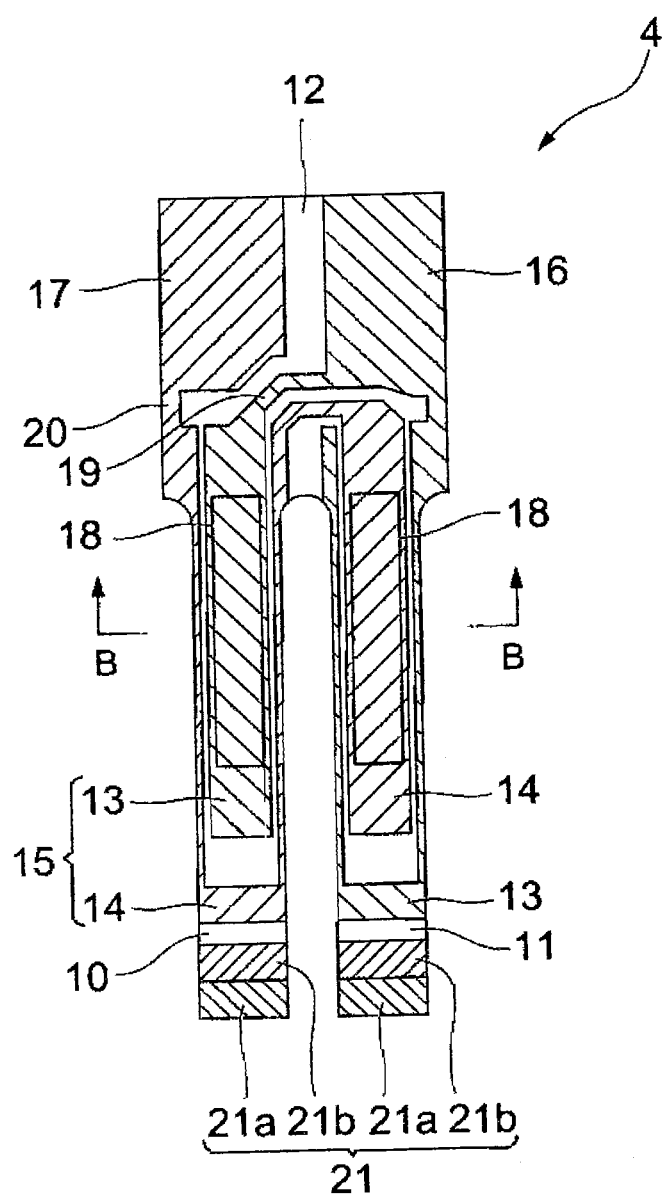
FIG. 5 is a top view of a piezoelectric vibrating reed of the piezoelectric vibrator shown in FIG. 1.
Figure 6:
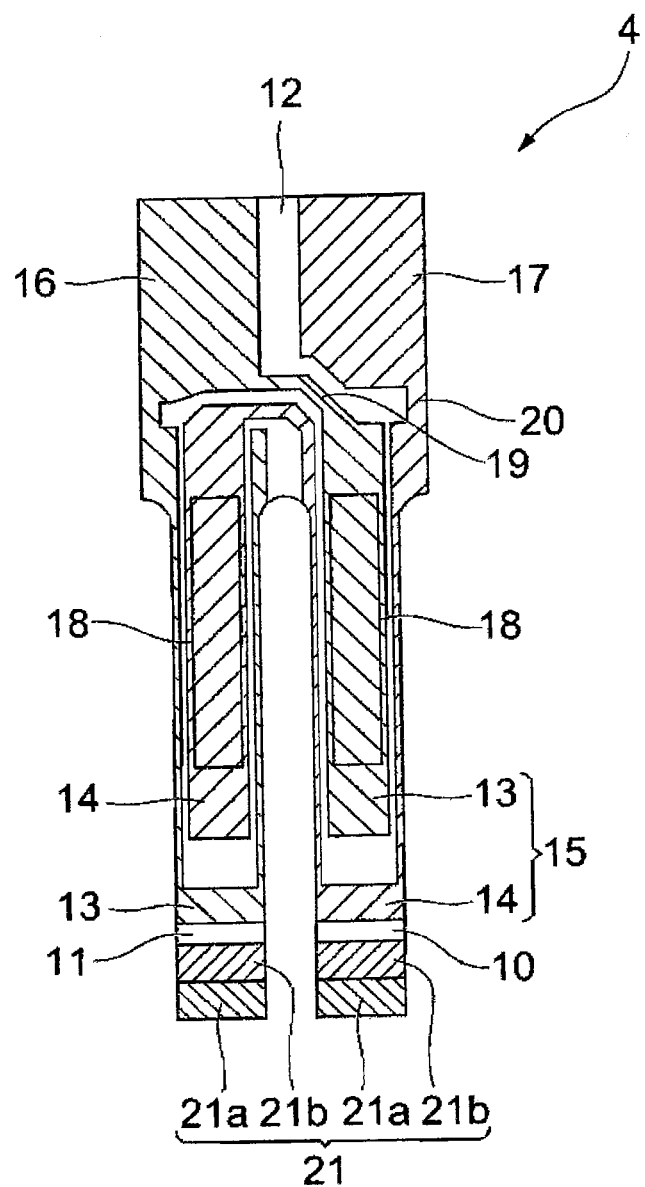
FIG. 6 is a bottom view of the piezoelectric vibrating reed shown in FIG. 5.
Figure 7:
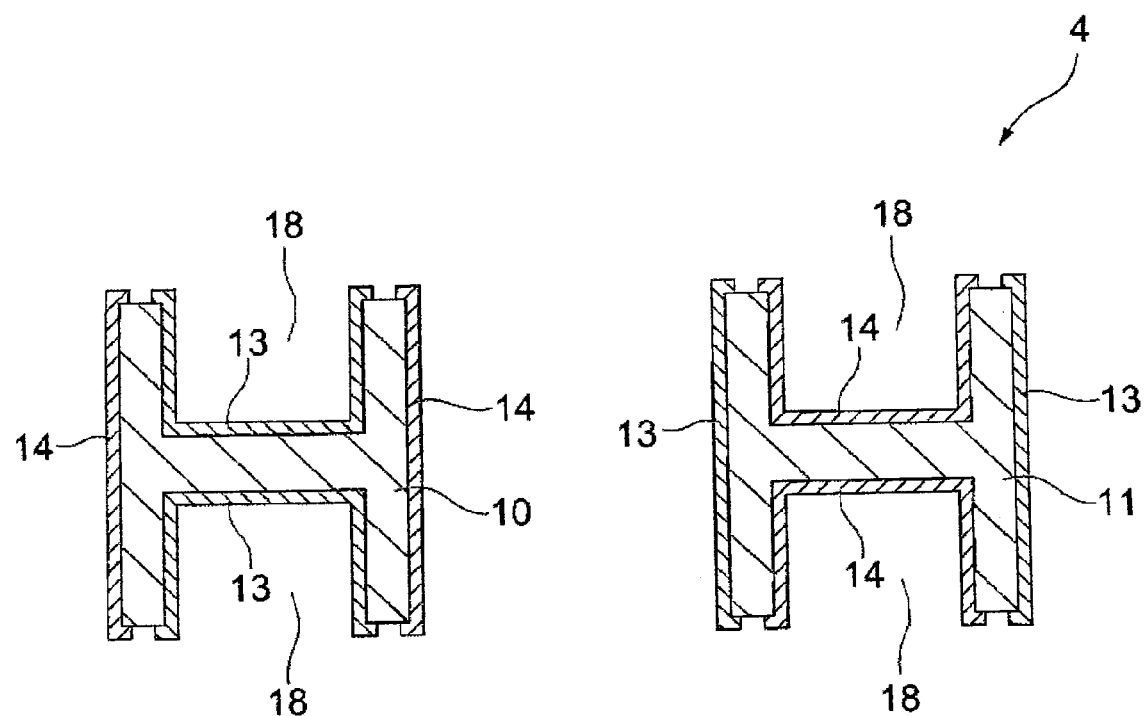
FIG. 7 is a cross-sectional view taken along a line B-B shown in FIG. 5.

As shown in FIGS. 5 to 7, the piezoelectric vibrating reed 4 is a tuning-fork type vibrating reed that is made of a piezoelectric material, such as crystal, lithium tantalite, or lithium niobate. When a predetermined voltage is applied to the piezoelectric vibrating reed, the piezoelectric vibrating reed vibrates.

The piezoelectric vibrating reed 4 includes a pair of vibration arm portions 10 and 11 that is disposed parallel to each other, a base portion 12 that integrally fixes the base ends of the pair of vibration arm portions 10 and 11, excitation electrodes 15 that each include first and second excitation electrodes 13 and 14, and mount electrodes 16 and 17 that are electrically connected to the first and second excitation electrodes 13 and 14. The first and second excitation electrodes are formed on the outer surfaces of the pair of vibration arm portions 10 and 11, and vibrate the pair of vibration arm portions 10 and 11.

Further, the piezoelectric vibrating reed 4 of this embodiment includes groove portions 18 that are formed on the main surfaces of the pair of vibration arm portions 10 and 11 in the longitudinal directions of the vibration arm portions 10 and 11, respectively. The groove portions 18 are formed from the base ends of the vibration arm portions 10 and 11 to the substantially middle portions thereof.

The excitation electrode 15 including the first and second excitation electrodes 13 and 14 is an electrode for vibrating the pair of vibration arm portions 10 and 11 at a predetermined resonant frequency in a direction where the vibration arm portions approach each other or are separated from each other. The first and second excitation electrodes are patterned on the outer surfaces of the pair of vibration arm portions 10 and 11 so as to be electrically isolated, respectively. Specifically, as shown in FIG. 7, the first excitation electrode 13 is mainly formed on the groove portions 18 of one vibration arm portion 10 and both side surfaces of the other vibration arm portion 11, and the second excitation electrode 14 is mainly formed on both side surfaces of one vibration arm portion 10 and the groove portions 18 of the other vibration arm portion 11.

Further, as shown in FIGS. 5 and 6, the first and second excitation electrodes 13 and 14 are electrically connected to the mount electrodes 16 and 17 through the extraction electrodes 19 and 20 on both the main surfaces of the base portion 12, respectively. Further, a voltage is applied to the piezoelectric vibrating reed 4 through the mount electrodes 16 and 17.

Meanwhile, the excitation electrodes 15, the mount electrodes 16 and 17, and the extraction electrodes 19 and 20, which have been described above, are formed by forming conductive films made of, for example, chrome (Cr), nickel (Ni), aluminum (Al), or titanium (Ti).

Furthermore, a weight metal film 21, which performs adjustment (frequency adjustment) so as to make the vibrational states of the vibration arm portions be in a predetermined frequency range, is formed at the ends of the pair of vibration arm portions 10 and 11. Meanwhile, the weight metal film 21 is divided into a rough adjustment film 21a that is used to roughly adjust frequency and a fine adjustment film 21b that is used to finely adjust frequency. It may be possible to make the frequency of the pair of vibration arm portions 10 and 11 be in the nominal frequency range of a device by performing frequency adjustment with the rough and fine adjustment films 21a and 21b.

Figure 2:
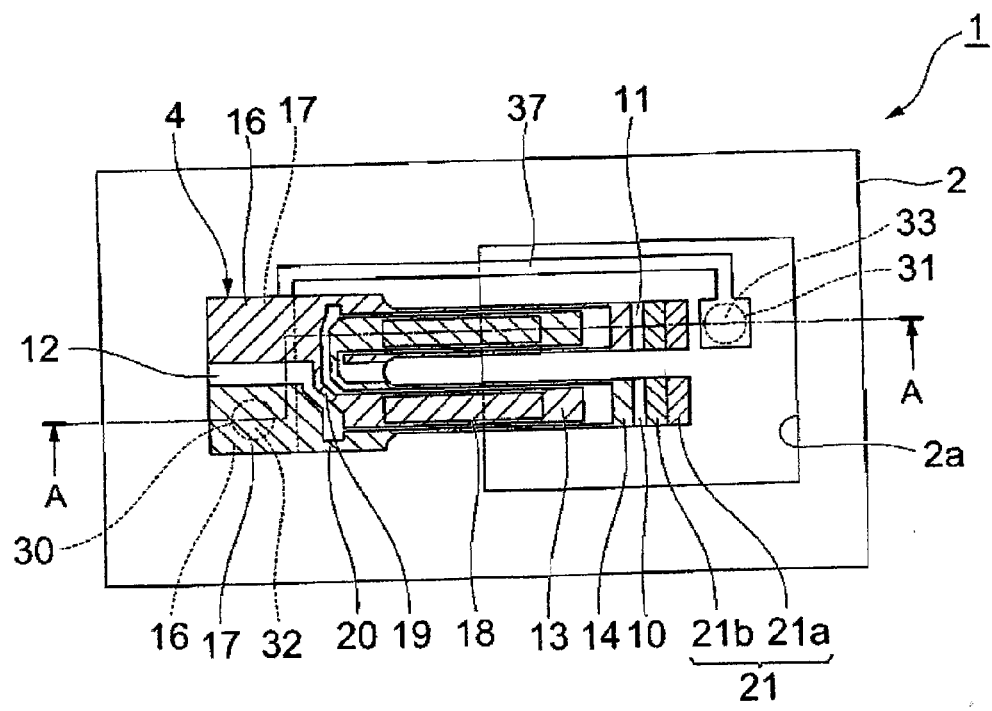
FIG. 2 is a view showing the internal structure of the piezoelectric vibrator shown in FIG. 1, and is a view showing a piezoelectric vibrating reed from the upper side when a lid substrate is removed.
Figure 3:
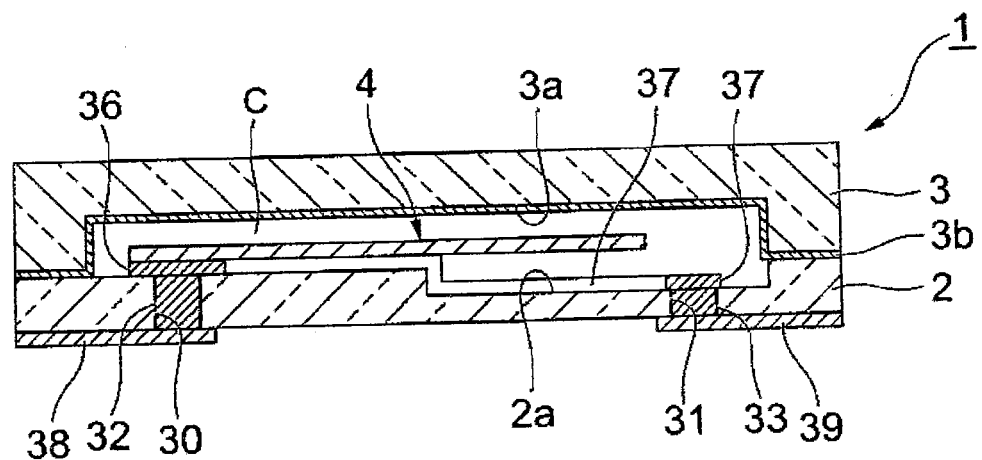
FIG. 3 is a cross-sectional view of the piezoelectric vibrator taken along a line A-A shown in FIG. 2.
Figure 4:
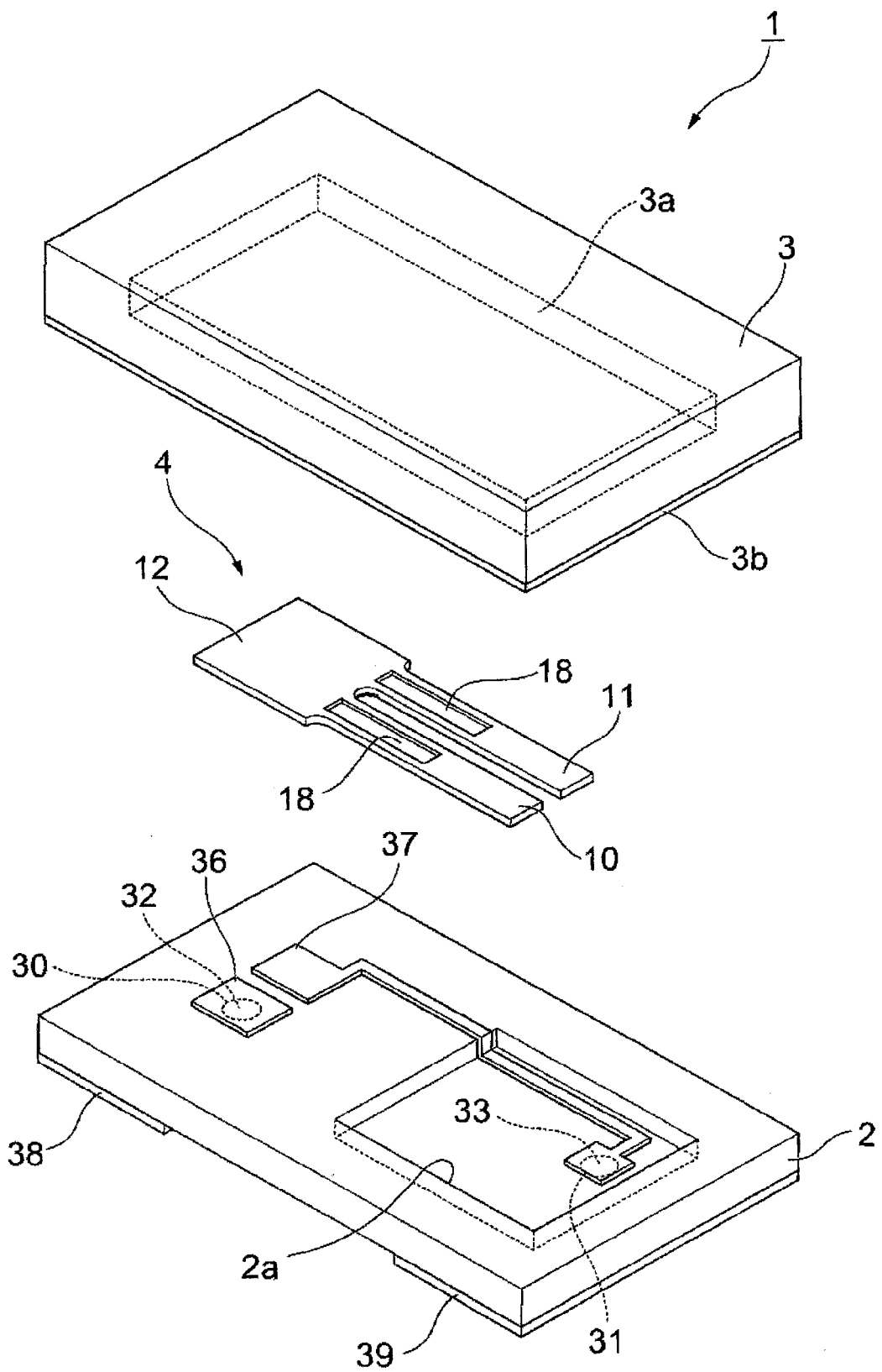
FIG. 4 is an exploded perspective view of the piezoelectric vibrator shown in FIG. 1.

As shown in FIGS. 2 to 4, the piezoelectric vibrating reed 4 having the above-mentioned structure is bonded to the upper surface of the base substrate 2 by a conductive adhesive. More specifically, the pair of mount electrodes 16 and 17 is bonded on routing electrodes 36 and 37 patterned on the upper surface of the base substrate 2 so as to come into contact with the routing electrodes, respectively. Accordingly, the piezoelectric vibrating reed 4 is in a state where the mount electrodes 16 and 17 are electrically connected to the routing electrodes 36 and 37, respectively.

The lid substrate 3 is a transparent insulating substrate that is made of a glass material, for example, soda-lime glass. The lid substrate is formed in the shape of a plate as shown in FIGS. 1, 3, and 4. Further, a rectangular recess 3a in which the piezoelectric vibrating reed 4 is received is formed on the lower surface of the lid substrate 3 (a bonding surface of the lid substrate to which the base substrate 2 is bonded). The recess 3a forms a cavity C, in which the piezoelectric vibrating reed 4 is received, together with a recess 2a (to be described below) of the base substrate 2 when both the substrates 2 and 3 are superimposed. A bonding film 3b for anodic bonding is patterned on the entire lower surface of the lid substrate 3 with a conductive material (for example, aluminum). Further, the lid substrate 3 is anodically bonded to the base substrate 2 by using the bonding film 3b so that the recess 3a faces the base substrate 2.

Like the lid substrate 3, the base substrate 2 is a transparent insulating substrate that is made of a glass material, for example, soda-lime glass. As shown in FIGS. 1 to 4, the base substrate is formed in the shape of a plate so as to have a size capable of being superimposed on the lid substrate 3. As shown in FIGS. 2 to 4, a recess 2a forming the cavity C is formed on the upper surface of the base substrate 2 (a bonding surface of the base substrate to which the lid substrate 3 is bonded). In more detail, the recess 2a is formed so as to correspond to the end of the piezoelectric vibrating reed 4 that is mounted on the base substrate 2. Accordingly, the pair of vibration arm portions 10 and 11 of the piezoelectric vibrating reed 4 is floated from the base substrate 2. Due to the recess 2a, it may be possible to secure a vibration gap that is required for the vibration of the pair of vibration arm portions 10 and 11 of the piezoelectric vibrating reed 4.

Further, a pair of through holes 30 and 31 passing through the base substrate 2 is formed at the base substrate 2. In this case, the pair of through holes 30 and 31 is formed so as to be in the cavity C. In more detail, the through holes 30 and 31 of this embodiment are formed so that one through hole 30 is positioned so as to correspond to the base portion 12 of the mounted piezoelectric vibrating reed 4 and the other through hole 31 is positioned so as to correspond to the ends of the vibration arm portions 10 and 11. Further, a pair of through electrodes 32 and 33, which is formed so as to fill the through holes 30 and 31, is formed at the pair of through holes 30 and 31. The through electrodes 32 and 33 function to completely close the through holes 30 and 31 so as to maintain the airtightness in the cavity C, and to electrically connect the routing electrodes 36 and 37 to external electrodes 38 and 39.

The pair of routing electrodes 36 and 37 is patterned on the upper surface of the base substrate 2 with a conductive material (for example, aluminum) so as to electrically connect one through electrode 32 of the pair of through electrodes 32 and 33 to one mount electrode 16 of the piezoelectric vibrating reed 4 and electrically connect the other through electrode 33 of the pair of through electrodes to the other mount electrode 17 of the piezoelectric vibrating reed 4. In more detail, one routing electrode 36 is formed immediately above the through electrode 32 so as to be positioned immediately below the base portion 12 of the piezoelectric vibrating reed 4. Further, the other routing electrode 37 is formed so as to be routed from a position adjacent to one routing electrode 36 to the ends of the vibration arm portions 10 and 11 along the vibration arm portions 10 and 11 and be then positioned immediately above the through electrode 33.

Further, the piezoelectric vibrating reed 4 is mounted on the pair of routing electrodes 36 and 37. Accordingly, one mount electrode 16 of the piezoelectric vibrating reed 4 is electrically connected to one through electrode 32 through one routing electrode 36, and the other mount electrode 17 is electrically connected to the other through electrode 33 through the other routing electrode 37.

Moreover, as shown in FIGS. 1, 3, and 4, a pair of external electrodes 38 and 39, which is electrically connected to the pair of through electrodes 32 and 33, respectively, is formed on the lower surface of the base substrate 2. That is, one external electrode 38 is electrically connected to the first excitation electrode 13 of the piezoelectric vibrating reed 4 through the one through electrode 32 and one routing electrode 36. Further, the other external electrode 39 is electrically connected to the second excitation electrode 14 of the piezoelectric vibrating reed 4 through the other through electrode 33 and the other routing electrode 37. Furthermore, as shown in FIG. 3, the external electrode 39, which is formed so as to correspond to the ends of the pair of vibration arm portions 10 and 11 of the piezoelectric vibrating reed 4, is formed not to overlap the ends of the vibration arm portions 10 and 11 when being viewed from the lower surface of the base substrate 2.

A predetermined driving voltage is applied to the external electrodes 38 and 39 formed on the base substrate 2 for the operation of the piezoelectric vibrator 1 having the above-mentioned structure. Accordingly, it may be possible to make current flow in the excitation electrode 15 including the first and second excitation electrodes 13 and 14 of the piezoelectric vibrating reed 4, and to vibrate the pair of vibration arm portions 10 and 11 at a predetermined frequency in a direction where the vibration arm portions approach each other or are separated from each other. Further, the vibration of the pair of vibration arm portions 10 and 11 may be used as a time source, a timing source of a control signal, a reference signal source, and the like.

Figure 8:
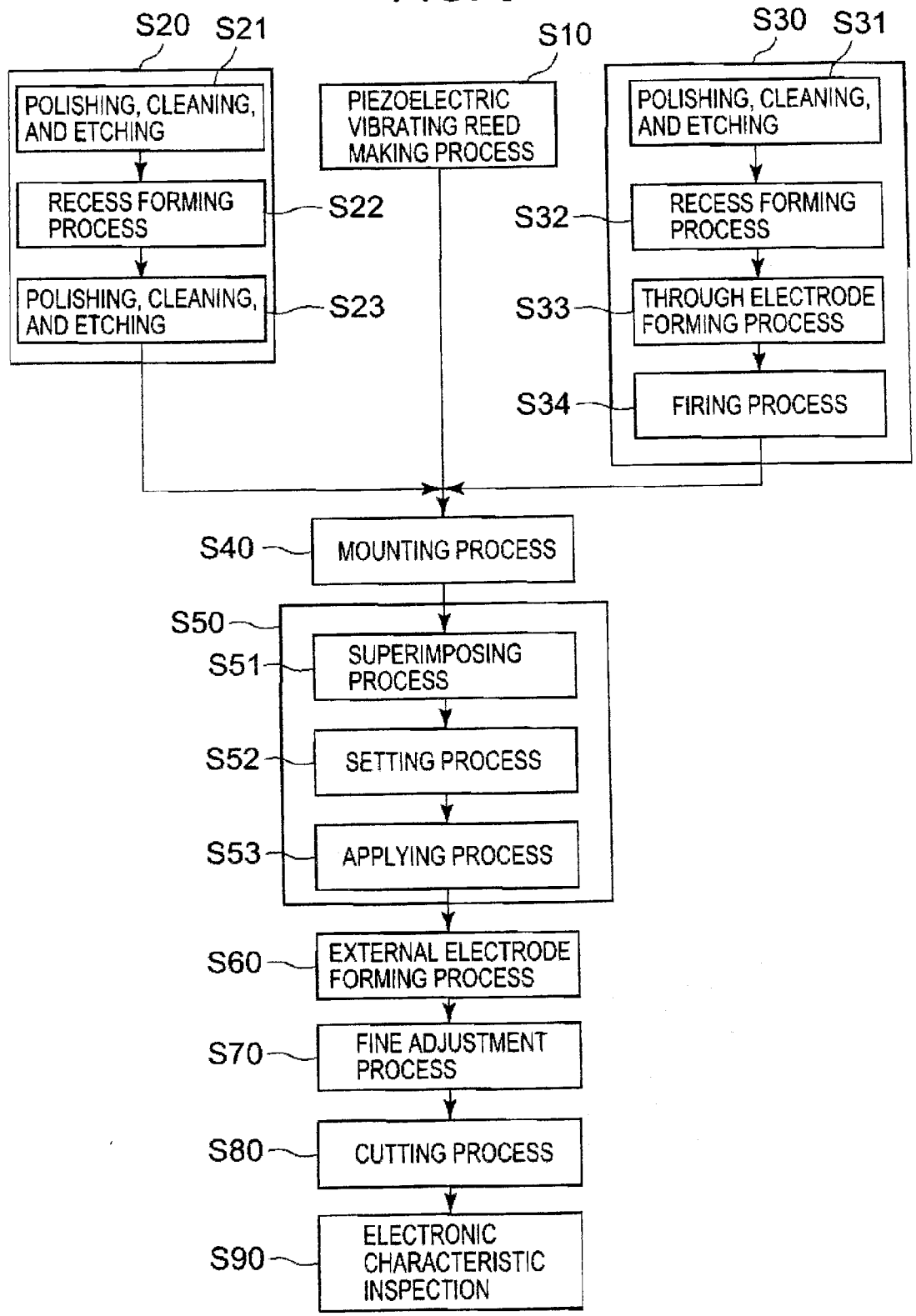
FIG. 8 is a flowchart illustrating a process flow during the manufacture of the piezoelectric vibrator shown in FIG. 1.

A method of manufacturing a plurality of the above-mentioned piezoelectric vibrators 1 at a time by using a base substrate wafer (base substrate) 40 and a lid substrate wafer (lid substrate) 50 will be described below with reference to the flowchart shown in FIG. 8. Meanwhile, a plurality of piezoelectric vibrators 1 is manufactured at a time by using wafer-shaped substrates in this embodiment, but the invention is not limited thereto. Piezoelectric vibrators may be manufactured one by one by processing substrates, which previously have dimensions corresponding to the outlines of the base substrate 2 and the lid substrate 3.

First, the piezoelectric vibrating reeds 4 shown in FIGS. 5 to 7 are formed by a piezoelectric vibrating reed making process (S10). Specifically, first, a Lambert raw stone of crystal is sliced at a predetermined angle so that wafers having a uniform thickness are formed. Subsequently, after the wafer is roughly worked by lapping, a work-affected layer is removed by etching. After that, mirror polishing working such as polishing is performed so that a wafer having a predetermined thickness is formed. Subsequently, after an appropriate treatment such as cleaning is performed on the wafer, the wafer is patterned so as to have the outline of the piezoelectric vibrating reed 4 by a photolithographic technique and the excitation electrodes 15, the extraction electrodes 19 and 20, the mount electrodes 16 and 17, and the weight metal films 21 are formed by the patterning and forming of a metal film. Accordingly, it may be possible to form a plurality of piezoelectric vibrating reeds 4.

Further, after the piezoelectric vibrating reeds 4 are made, the rough adjustment of a resonant frequency is performed. The rough adjustment of the resonant frequency is performed by irradiating the rough adjustment film 21a of the weight metal film 21 with laser light so that a part of the rough adjustment film is evaporated and the weight of the weight metal film is thus changed. Meanwhile, the fine adjustment for more accurately adjusting the resonant frequency is performed after mounting. This will be described below.

Figure 9:
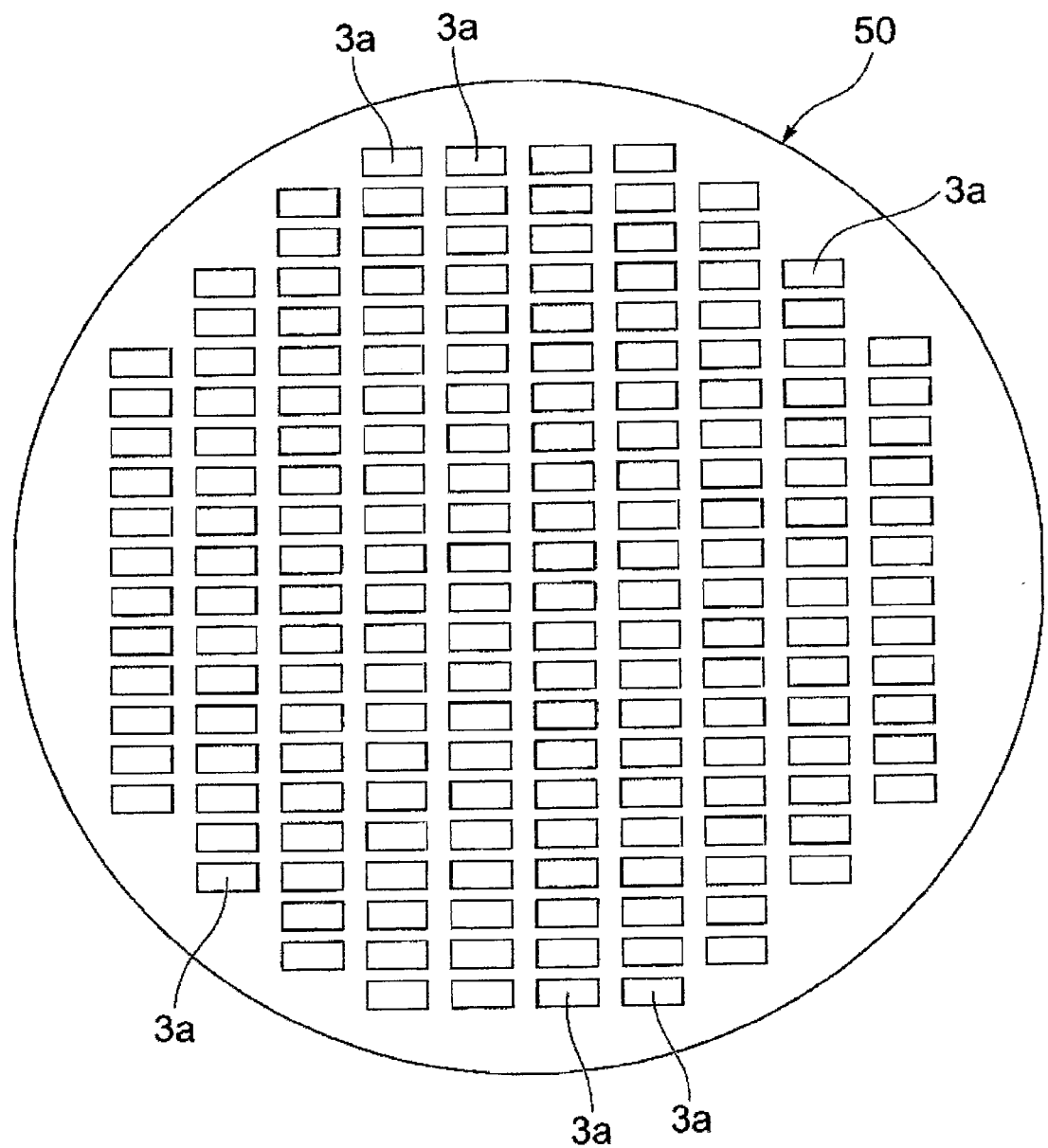
FIG. 9 is a view illustrating one process when a piezoelectric vibrator is manufactured according to the flowchart illustrated in FIG. 8, and is a view showing a state a plurality of recesses and a bonding film is formed on a lid substrate wafer that is a material of a lid substrate.

After that, there is performed a first wafer making process (S20) for making the lid substrate wafer 50, which forms the lid substrate 3 later, up to a state immediately before the anodic bonding is performed. First, after soda-lime glass is polished up to a predetermined thickness and cleaned, a disk-shaped lid substrate wafer 50 of which the outermost work-affected layer is removed by etching or the like is formed (S21). Then, there is performed a recess forming process (S22) for forming a plurality of recesses 3a for cavities C on the lower surface of the lid substrate wafer 50 in row and column directions as shown in FIG. 9 by etching or the like.

Then, there is performed a bonding film forming process (S23) for forming a conductive bonding film 3b on the entire lower surface of the lid substrate wafer 50, on which the recesses 3a are formed, by a method, such as deposition or sputtering. The first wafer making process is terminated at this time.

Subsequently, simultaneously with the process or before and after the process, there is performed a second wafer making process (S30) for making the base substrate wafer 40, which forms the base substrate 2 later, up to a state immediately before the anodic bonding is performed. First, after soda-lime glass is polished up to a predetermined thickness and cleaned, a disk-shaped base substrate wafer 40 of which the outermost work-affected layer is removed by etching or the like is formed (S31).

After that, there is performed a recess forming process (S32) for forming a plurality of recesses 2a for cavities C on the upper surface of the base substrate wafer 40 in row and column directions by etching or the like. In this case, the recess 2a is formed so as to be positioned near the ends the vibration arm portions 10 and 11 of the piezoelectric vibrating reed 4.

Then, there is performed a through electrode forming process (S33) for forming a plurality of pairs of through electrodes 32 and 33 at the base substrate wafer 40. Specifically, first, a plurality of pairs of through holes 30 and 31 is formed by a method, such as a sandblasting method or a press work. Pairs of through electrodes 32 and 33 are formed in the plurality of pairs of through holes 30 and 31. By the pairs of through electrodes 32 and 33, the pairs of through holes 30 and 31 are sealed, and electric conductivity between the upper and lower surfaces of the base substrate wafer 40 is secured.

Figure 10:
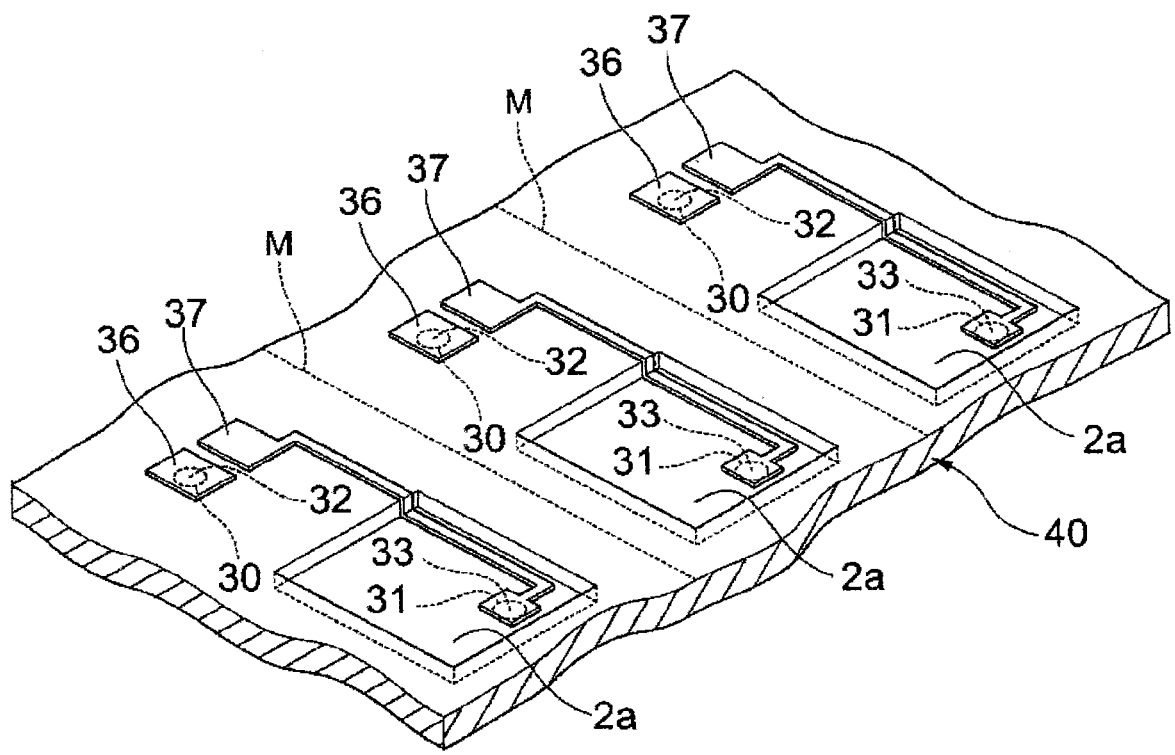
FIG. 10 is a view illustrating one process when a piezoelectric vibrator is manufactured according to the flowchart illustrated in FIG. 8, and is a view showing a state where recesses, through electrodes, and routing electrodes are formed at a base substrate wafer that is a material of a base substrate.
Figure 11:
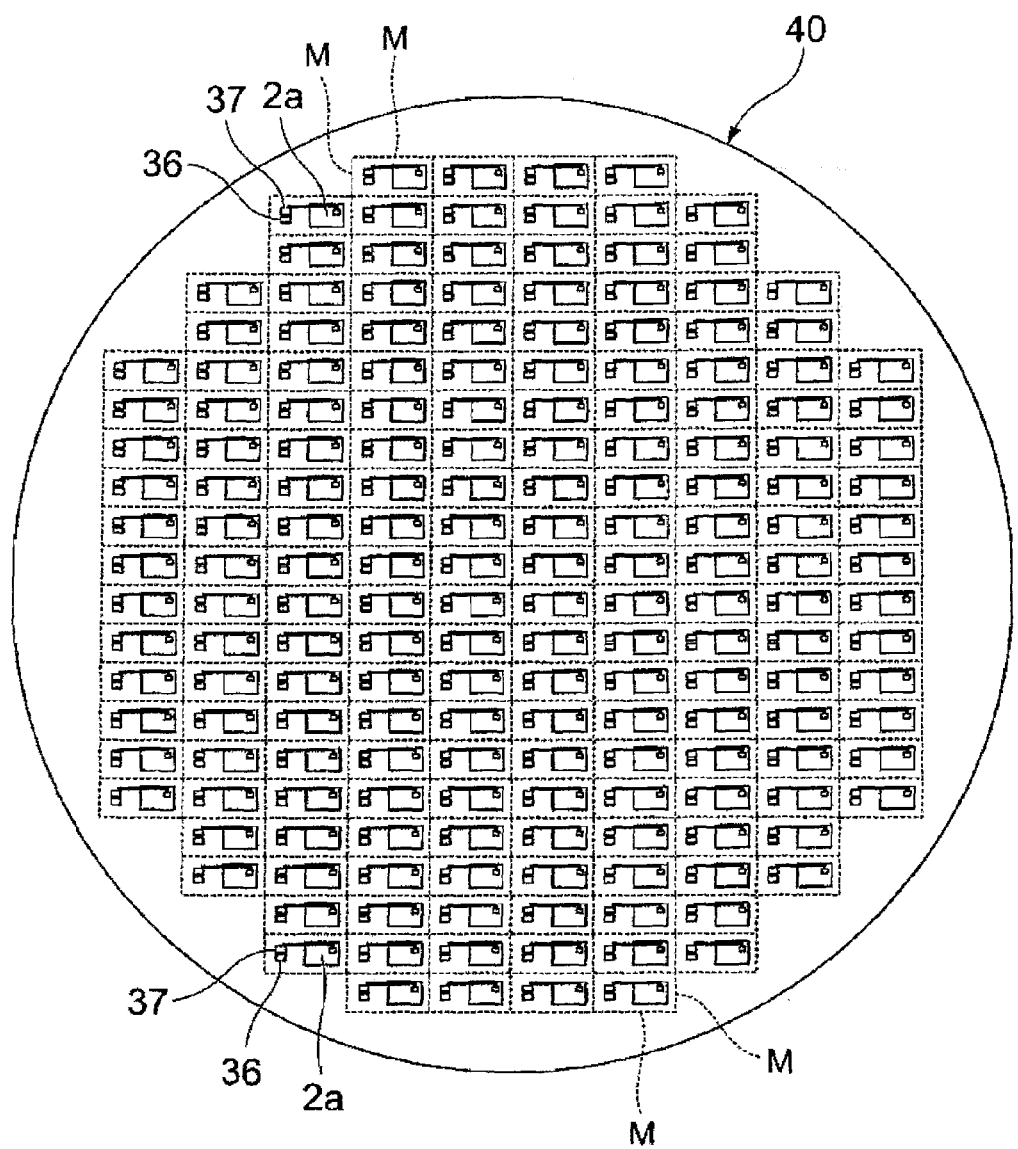
FIG. 11 is a view showing the entire base substrate wafer that is in the state shown in FIG. 10.

Subsequently, there is performed a routing electrode forming process (S34) for forming a plurality of routing electrodes 36 and 37, which is electrically connected to the pairs of through electrodes 32 and 33, respectively, as shown in FIGS. 10 and 11 by performing patterning on the upper surface of the base substrate wafer 40 with a conductive material. Meanwhile, dotted lines M shown in FIGS. 10 and 11 are cutting lines along which cutting is performed in a cutting process to be performed later. The second wafer making process is terminated at this time.

After that, there is performed a mounting process (S40) for bonding the plurality of made piezoelectric vibrating reeds 4 to the upper surface of the base substrate wafer 40 through the routing electrodes 36 and 37, respectively. Accordingly, the piezoelectric vibrating reeds 4 are in a state where the mount electrodes 16 and 17 are electrically connected to the routing electrodes 36 and 37, respectively. Therefore, the pair of the excitation electrodes 15 of the piezoelectric vibrating reed 4 is electrically connected to the pair of through electrodes 32 and 33, respectively.

After the mounting process, there is performed a bonding process (S50) for anodically bonding the two superimposed wafers by putting the two superimposed wafers 40 and 50 in an anodic bonding apparatus (not shown). More specifically, first, there is performed a superimposing process (S51) for superimposing the lid substrate wafer 50 on the base substrate wafer 40. Specifically, while reference marks (not shown) are used as indexes, both the wafers 40 and 50 are aligned in position. Accordingly, the mounted piezoelectric vibrating reeds 4 are received in the cavities C that are surrounded by both the wafers 40 and 50, respectively.

Figure 12:
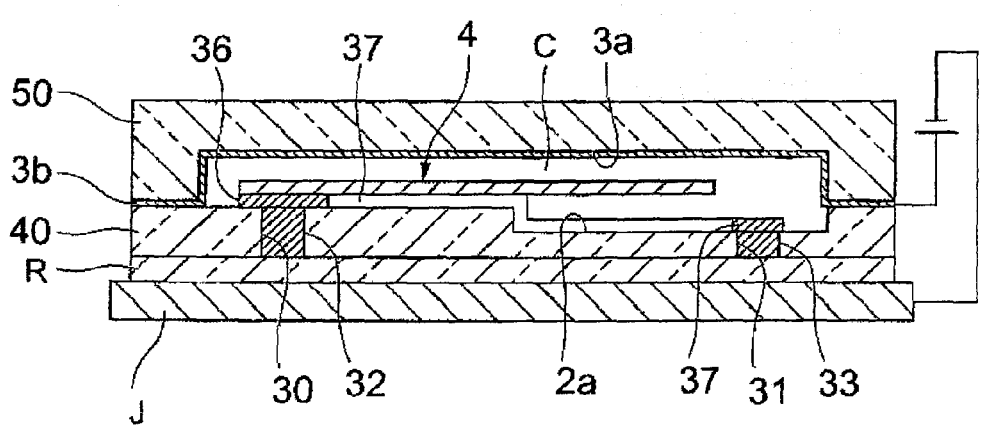
FIG. 12 is a view illustrating one process when a piezoelectric vibrator is manufactured according to the flowchart illustrated in FIG. 8, and is a cross-sectional view taken along the line A-A shown in FIG. 2 and showing a state where the base substrate wafer and the lid substrate wafer, which are superimposed, are anodically bonded to each other.

Subsequently, as shown in FIG. 12, there is performed a setting process (S52) for placing a dummy member R on a metal jig (electrode plate) J and placing the superimposed wafers 40 and 50 on the dummy member R so that the base substrate wafer 40 faces the dummy member R. In this case, a member made of a material in which ions can be transferred at a bonding temperature is used as the dummy member R. Specifically, for example, a glass material, which is the same material as the material of the base substrate wafer 40, is used as the material of the dummy member. Further, for example, stainless steel (SUS) or the like is used as the material of the metal jig J. Meanwhile, for description, not the entire wafers 40 and 50 but a portion of the wafers corresponding to one piezoelectric vibrator 1 is shown in FIG. 12.

After that, there is performed an applying process (S53) for applying a bonding voltage (for example, 0.5 to 5.0 kV) between the metal jig J and the bonding film 3b after heating the base substrate wafer 40 and the dummy member R, which are placed, up to a bonding temperature (for example, 200 to 300° C.). Accordingly, an electrochemical reaction occurs on the interface between the bonding film 3b and the base substrate wafer 40, and the bonding film and the base substrate wafer come into close contact with each other and are anodically bonded to each other.

Figure 13:
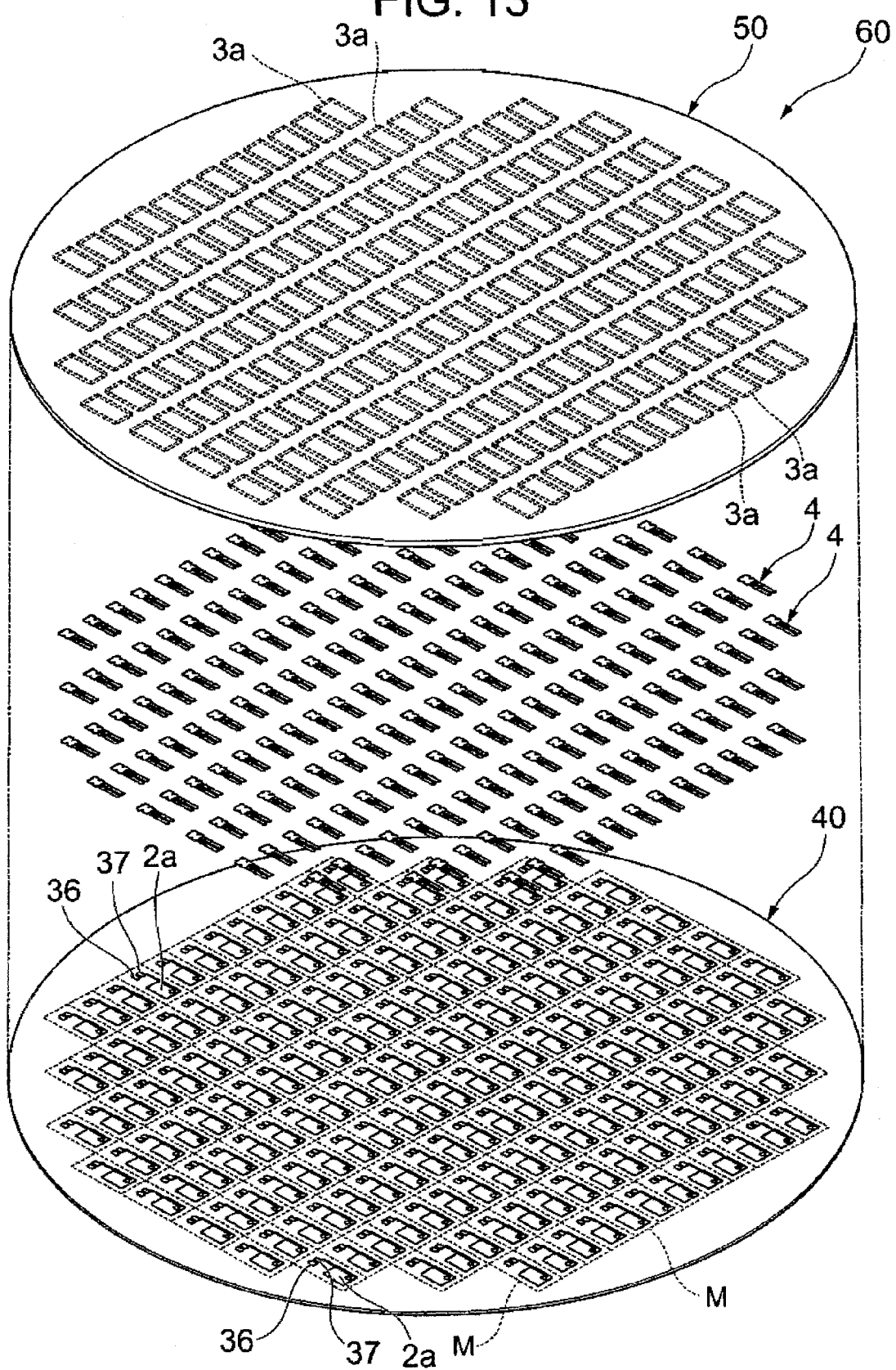
FIG. 13 is a view illustrating one process when a piezoelectric vibrator is manufactured according to the flowchart illustrated in FIG. 8, and is an exploded perspective view of a wafer where the base substrate wafer and the lid substrate wafer are anodically bonded to each other so that the piezoelectric vibrating reeds are in cavities.

Accordingly, it may be possible to seal the piezoelectric vibrating reed 4 in the cavity C, and to obtain a wafer 60 shown in FIG. 13 where the base substrate wafer 40 and the lid substrate wafer 50 are bonded to each other. Meanwhile, for the easy understanding of the drawing, in FIG. 13, the exploded wafer 60 is shown and the bonding film 3b formed on the lid substrate wafer 50 is not shown. Further, dotted lines M shown in FIG. 13 are cutting lines along which cutting is performed in a cutting process to be performed later.

After the above-mentioned anodic bonding is terminated, there is performed an external electrode forming process (S60) for forming the plurality of pairs of external electrodes 38 and 39, which is electrically connected to the pairs of through electrodes 32 and 33, respectively, by performing patterning on the lower surface of the base substrate wafer 40 with a conductive material. Due to this process, it is possible to actuate the piezoelectric vibrating reed 4, which is sealed in the cavity C, by using the external electrodes 38 and 39.

After that, there is performed a fine adjustment process (S70) for finely adjusting the frequency of each of the piezoelectric vibrators 1 that are sealed in the cavities C in the state of the wafer 60. In detail, a voltage is applied to the pairs of external electrodes 38 and 39 formed on the lower surface of the base substrate wafer 40, so that the piezoelectric vibrating reeds 4 are vibrated. Further, while the frequency is measured, laser light is irradiated from the outside through the base substrate wafer 40, thereby evaporating the fine adjustment film 21b of the weight metal film 21. Accordingly, the weight of the ends of the pair of vibration arm portions 10 and 11 is changed. As a result, it may be possible to finely adjust the frequency of the each of the piezoelectric vibrating reeds 4 so that the frequency of the piezoelectric vibrating reeds is in a predetermined nominal frequency range.

After the fine adjustment of frequency is terminated, there is performed a cutting process (S80) for cutting the bonded wafer 60 into small pieces along the cutting lines M shown in FIG. 13. As a result, it may be possible to manufacture at a time a plurality of two-layer structure type surface mounted piezoelectric vibrators 1 of which one is shown in FIG. 1 and the piezoelectric vibrating reed 4 is sealed in the cavity C formed between the base substrate 2 and lid substrate 3 anodically bonded to each other.

Meanwhile, the fine adjustment process (S70) may be performed after the wafer is cut into individual piezoelectric vibrators 1 by the cutting process (S80). However, if the fine adjustment process (S70) is performed ahead as described above, fine adjustment can be performed in the state of the wafer 60, so that it may be possible to more efficiently perform the fine adjustment of the plurality of piezoelectric vibrators 1. Accordingly, since it may be possible to improve throughput, this is preferable.

After that, an internal electronic characteristic inspection is performed (S90). That is, the drive level characteristics, the resonance resistance value, the resonant frequency (excitation power dependence of resonance resistance value and resonant frequency) and the like of the piezoelectric vibrating reeds 4 are measured and checked. Further, insulation resistance characteristics and the like are also checked. Furthermore, the appearances of the piezoelectric vibrators 1 are finally inspected to finally check dimension, quality, and the like. As a result, the manufacture of the piezoelectric vibrators 1 is terminated.

Figure 14:
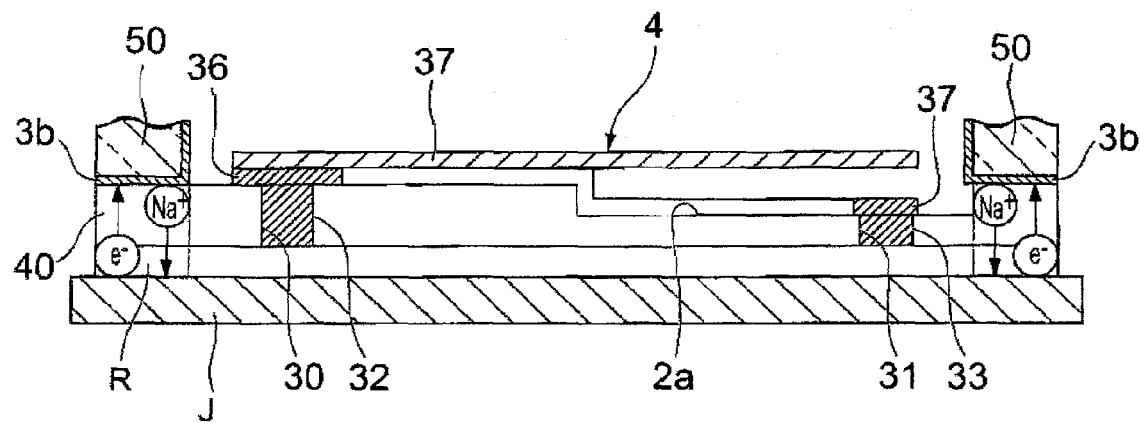
FIG. 14 is a view illustrating that ions are transferred in a dummy member and the base substrate in the state shown in FIG. 12.

In particular, a member made of a glass material in which ions can be transferred at a bonding temperature is used as the dummy member R. Accordingly, the dummy member, the metal jig, and the wafers are heated up to a bonding temperature and a driving voltage is applied between the metal jig J and the bonding film 3b by the heating process and the applying process, so that the transfer of ions (charged particles) locally occurs in the base substrate wafer 40 and the dummy member R, which are interposed between the metal jig J and the bonding film 3b. As a result, current flows in the base substrate wafer and the dummy member. More specifically, when the bonding film 3b is connected to an anode and the dummy member R is connected to a cathode, sodium ions in the glass material, which forms the base substrate wafer 40 and the dummy member R, are transferred to the dummy member R from the bonding film 3b and electrons are transferred to the bonding film from the dummy member as shown in FIG. 14.

In contrast, the bonding film 3b does not come into contact with the through electrodes 32 and 33, and the through electrodes 32 and 33 are not interposed between the metal jig J and the bonding film 3b. Accordingly, even when a voltage is applied between the bonding film 3b and the metal jig J, the transfer of ions does not occur. In addition, since the dummy member R is interposed between the through electrodes 32 and 33 and the metal jig J, current does not directly flow from the metal jig J to the through electrodes 32 and 33. That is, even though a bonding voltage is applied between the bonding film 3b and the metal jig J in the applying process, current does not flow in the through electrodes 32 and 33 and a potential difference as high as the bonding voltage cannot be generated between the bonding film 3b and the through electrodes. For this reason, it may be possible to suppress the occurrence of electric discharge (spark discharge) that has frequently occurred in the related art between the bonding film 3b and the through electrodes 32 and 33.

Accordingly, it may be possible to prevent the melting of the through electrodes 32 and 33 that is caused by electric discharge. Therefore, it may be possible to secure stable electric conductivity between the piezoelectric vibrating reed 4 and the external electrodes 38 and 39, and to secure airtightness in the cavity. As a result, it may be possible to improve the quality of the piezoelectric vibrator 1.

In addition, it may be possible to sufficiently secure current, which flows in the bonding film 3b and the base substrate wafer 40, by suppressing electric discharge. Accordingly, it may be possible to make the bonding film and the base substrate wafer come into close contact with each other by anodic bonding, and to secure airtightness even on the bonding surfaces of both the wafers 40 and 50.

Further, since only a simple method, which interposes the dummy member R between the base substrate wafer 40 and the metal jig J, is used, it may be possible to use facilities in the related art. Therefore, it may be possible to manufacture the piezoelectric vibrator at low cost.

Furthermore, a glass material, which is the same material as the material of the base substrate wafer 40, is used as the material of the dummy member R in this embodiment. Accordingly, when being heated in the applying process, the base substrate wafer 40 and the dummy member R thermally expand to the same degree. Therefore, there is no concern that the base substrate wafer 40 is partially floated from the dummy member R due to the excessive expansion of just one of the base substrate wafer and the dummy member. That is, it may be possible to perform the applying process while the base substrate wafer 40 and the dummy member R come into close contact with each other. Accordingly, it may be possible to more reliably perform anodic bonding between the base substrate wafer 40 and the lid substrate wafer 50, and to further improve the quality of the piezoelectric vibrator 1.

An embodiment of an oscillator according to the invention will be described below with reference to FIG. 15.

Figure 15:
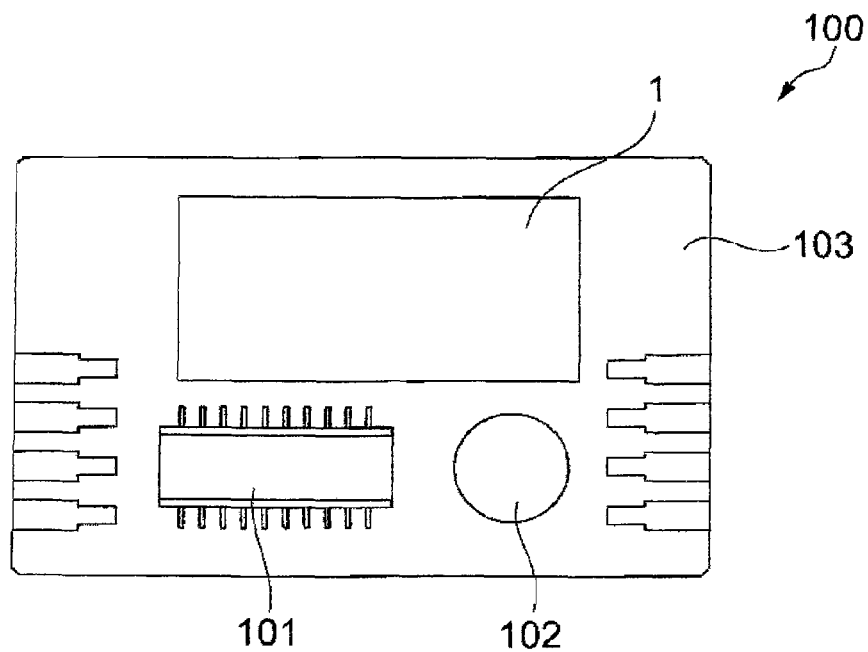
FIG. 15 is a view showing the configuration of an embodiment of an oscillator according to the invention.

As shown in FIG. 15, an oscillator 100 according to this embodiment includes the piezoelectric vibrator 1 as an oscillating component that is electrically connected to an integrated circuit 101. The oscillator 100 includes a substrate 103 on which an electronic component 102 such as a capacitor is mounted. The integrated circuit 101 for the oscillator is mounted on the substrate 103, and the piezoelectric vibrator 1 is mounted near the integrated circuit 101 on the substrate. The electronic component 102, the integrated circuit 101, and the piezoelectric vibrator 1 are electrically connected to one another by wiring patterns (not shown). Meanwhile, each of the components is molded with a resin (not shown).

When a voltage is applied to the piezoelectric vibrator 1 of the oscillator 100 having the above-mentioned structure, the piezoelectric vibrating reed 4 of the piezoelectric vibrator 1 vibrates. The vibration is converted into an electrical signal due to the piezoelectric characteristics of the piezoelectric vibrating reed 4, and is input to the integrated circuit 101 as an electrical signal. The input electrical signal is subjected to various processes by the integrated circuit 101 and is output as a frequency signal. Accordingly, the piezoelectric vibrator 1 functions as an oscillating component.

Further, it is possible to add a function of controlling date or time of the operation of the device or an external device other than a single-function oscillator for a clock and the like or a function of providing time or a calendar by selectively setting the structure of the integrated circuit 101, for example, an RTC (real time clock) module and the like in compliance with demand.

As described above, the oscillator 100 according to this embodiment includes the high-quality piezoelectric vibrator 1 that has reliable airtightness in the cavity C and secures stable electric conductivity between the piezoelectric vibrating reed 4 and the external electrodes 38 and 39. Accordingly, likewise, it may also be possible to improve the quality of the oscillator 100. In addition to this, it may be possible to obtain a stable and accurate frequency signal over a long period of time.

Figure 16:
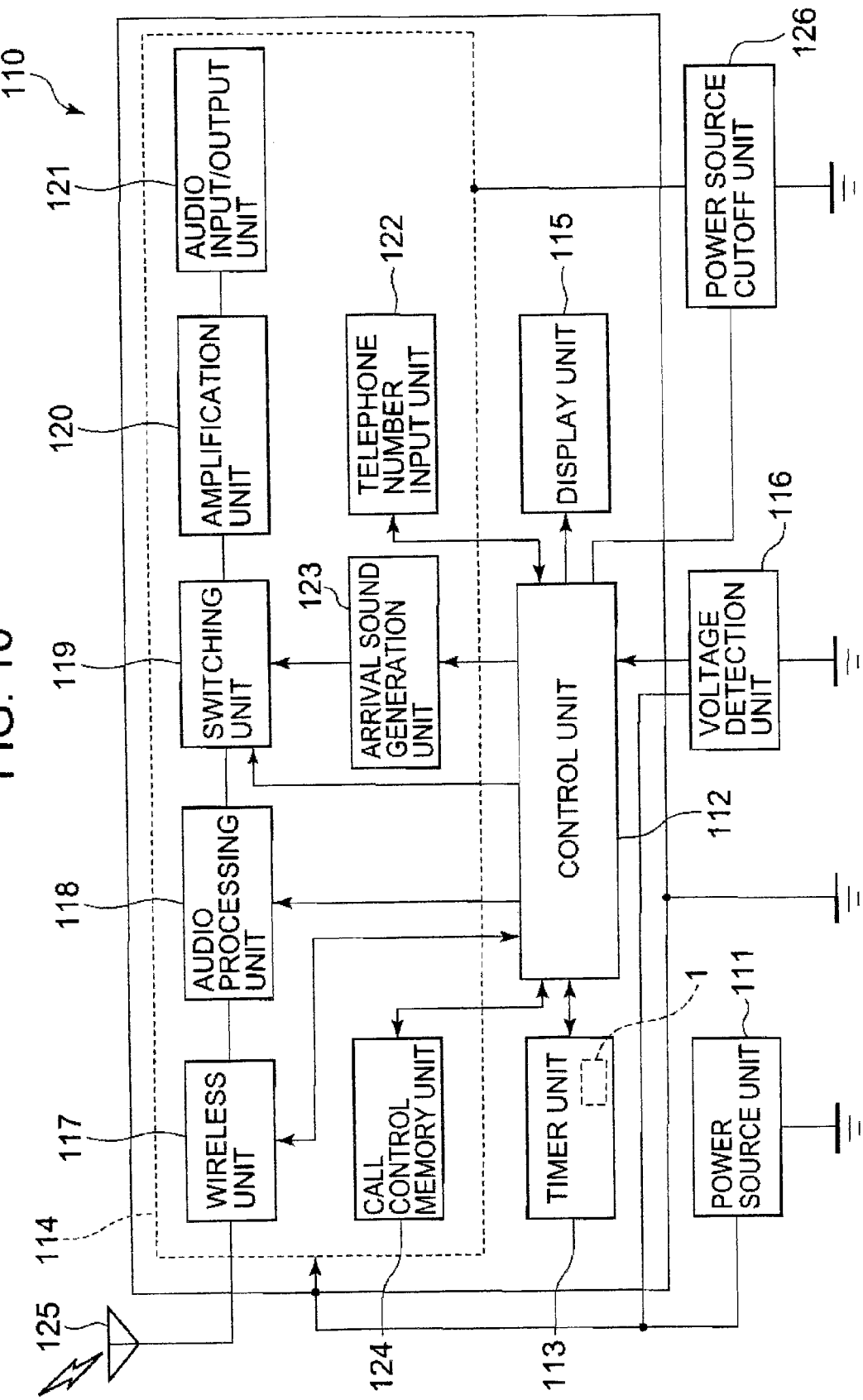
FIG. 16 is a view showing the configuration of an embodiment of an electronic device according to the invention.

An embodiment of an electronic device according to the invention will be described with reference to FIG. 16. Meanwhile, a portable information device 110 including the above-mentioned piezoelectric vibrator 1 will be exemplified as the electronic device. First, the portable information device 110 according to this embodiment is typified by, for example, a cell phone, and is obtained by developing and improving a watch in the related art. The portable information device is similar to a watch in appearance, a liquid crystal display is disposed at a portion of the portable information device corresponding to a dial, and the portable information device can display current time and the like on a screen of the liquid crystal display. Further, when the portable information device is used as a communication device, the portable information device may be used to perform communication like the cell phone in the related art through a speaker and a microphone that are built in an inner portion of a band after being separated from a wrist. However, the size and weight of the portable information device are much smaller than those of the cell phone in the related art.

The structure of the portable information device 110 according to this embodiment will be described below. As shown in FIG. 16, the portable information device 110 includes the piezoelectric vibrator 1 and a power supply unit 111 for supplying power. The power supply unit 111 is formed of, for example, a lithium secondary battery. A control unit 112 that performs various kind of control, a clock unit 113 that counts time and the like, a communication unit 114 that communicates with the outside, a display unit 115 that displays various kinds of information, and a voltage detection unit 116 that detects voltages of the respective functional units are connected in parallel to the power supply unit 111. Further, power is supplied to each of the functional units by the power supply unit 111.

The control unit 112 controls the operation of the entire system, such as the transmission and reception of voice data and the measurement or display of the current time, by controlling the respective functional units. Further, the control unit 112 includes a ROM where a program is written in advance, a CPU that reads out and executes the program written in the ROM, a RAM that is used as a work area of the CPU, and the like.

The clock unit 113 includes an integrated circuit and the piezoelectric vibrator 1. An oscillation circuit, a register circuit, a counter circuit, an interface circuit, and the like are built in the integrated circuit. When a voltage is applied to the piezoelectric vibrator 1, the piezoelectric vibrating reed 4 vibrates. The vibration is converted into an electrical signal due to the piezoelectric characteristics of crystal, and is input to the oscillation circuit as an electrical signal. The output of the oscillation circuit is binarized and counted by the register circuit and the counter circuit. Further, the clock unit transmits/receives a signal to/from the control unit 112 through the interface circuit. Current time, current date, calendar information, or the like is displayed on the display unit 115.

The communication unit 114 has the same function as the cell phone in the related art. The communication unit includes a wireless part 117, a voice processing part 118, a switching part 119, an amplifying part 120, a voice input/output part 121, a phone number input part 122, a ringtone generating part 123, and a call control memory part 124.

The wireless part 117 transmits/receives various data such as voice date to/from a base station through an antenna 125. The voice processing part 118 encodes and decodes a voice signal that is input from the wireless part 117 or the amplifying part 120. The amplifying part 120 amplifies a signal, which is input from the voice processing part 118 or the voice input/output part 121, up to a predetermined level. The voice input/output part 121 is formed of a speaker or a microphone or the like, and amplifies a ringtone or a received voice or collects a voice.

Further, the ringtone generating part 123 generates a ringtone in accordance with a call from a base station. The switching part 119 switches the amplifying part 120, which is connected to the voice processing part 118, to the ringtone generating part 123 when a call is received, so that the ringtone generated by the ringtone generating part 123 is output to the voice input/output part 121 through the amplifying part 120.

Meanwhile, the call control memory part 124 stores a program that is related to the outgoing/incoming call control of communication. Further, the phone number input part 122 includes number keys corresponding to, for example, 0 to 9 and other keys. When these number keys or the like are pressed down, the phone number of a callee is input.

When the voltage, which is applied to each functional unit such as the control unit 112 by the power supply unit 111, is lower than a predetermined value, the voltage detection unit 116 detects the voltage drop and notifies the control unit 112 of the voltage drop. The predetermined voltage value in this case is a value that is preset as the minimum voltage required for stably operating the communication unit 114, and is, for example, about 3 V. The control unit 112, which receives a notice of the voltage drop from the voltage detection unit 116, prohibits the operation of the wireless part 117, the voice processing part 118, the switching part 119, and the ringtone generating part 123. In particular, it is essential to stop the operation of the wireless part 117 having large power consumption. Further, a message that the communication unit 114 is not available due to the lack of the battery power is displayed on the display unit 115.

That is, the operation of the communication unit 114 is prohibited by the voltage detection unit 116 and the control unit 112, and a message that the operation of the communication unit is prohibited by the voltage detection unit and the control unit may be displayed on the display unit 115. The display may be a short message. However, an "x" (cross) mark may be displayed at a phone icon, which is displayed at an upper portion on the display screen of the display unit 115, as an intuitive display.

Meanwhile, if there is provided a power cutting-off unit 126 that can selectively cut off power applied to parts related to a function of the communication unit 114, it may be possible to more reliably stop the function of the communication unit 114.

As described above, the portable information device 110 according to this embodiment includes the high-quality piezoelectric vibrator 1 that has reliable airtightness in the cavity C and secures stable electric conductivity between the piezoelectric vibrating reed 4 and the external electrodes 38 and 39. Accordingly, likewise, it may also be possible to improve the quality of the portable information device. In addition to this, it may be possible to display a stable and accurate clock information over a long period of time.

An embodiment of a radio clock according to the invention will be described with reference to FIG. 17.

Figure 17:
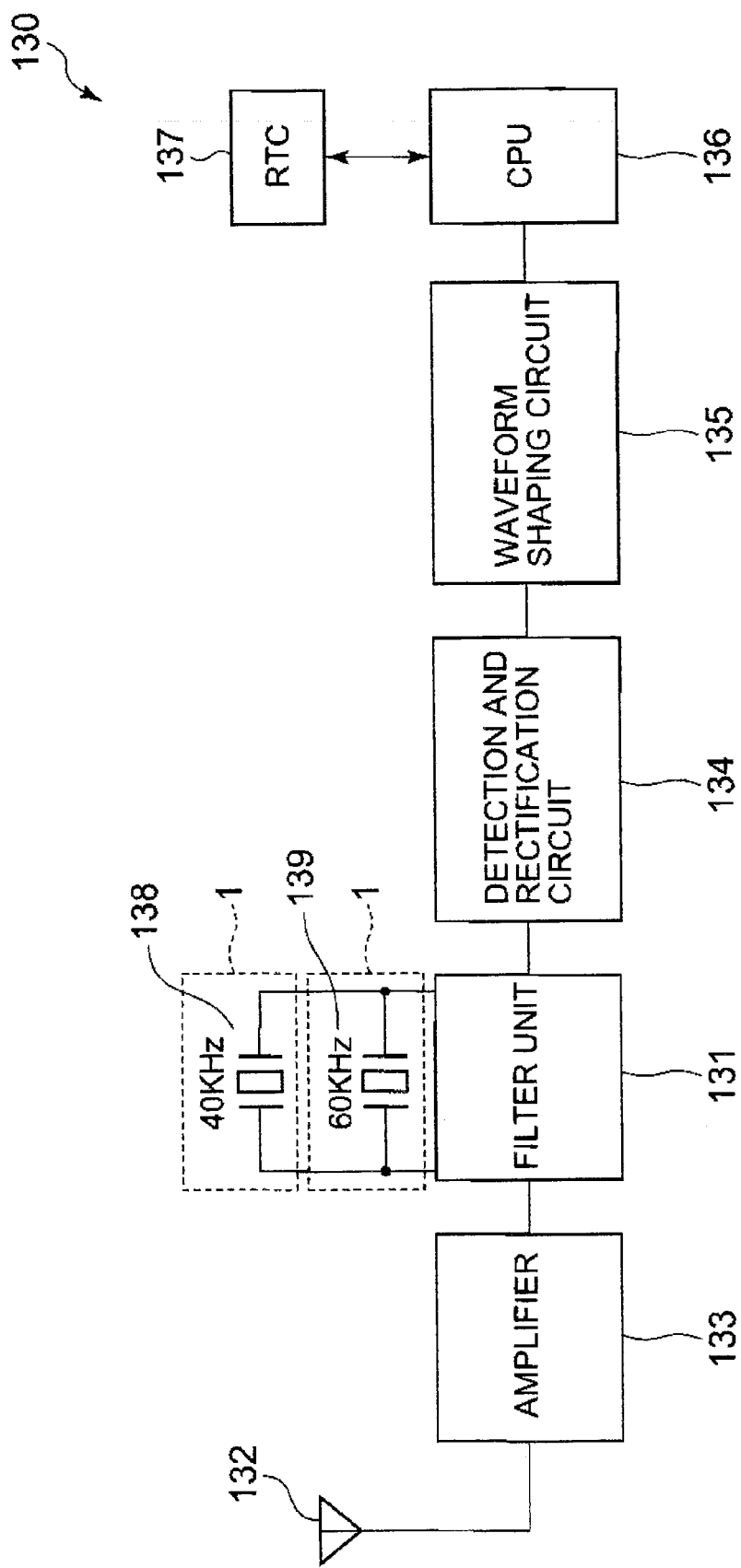
FIG. 17 is a view showing the configuration of an embodiment of a radio clock according to the invention.
Figure 18:
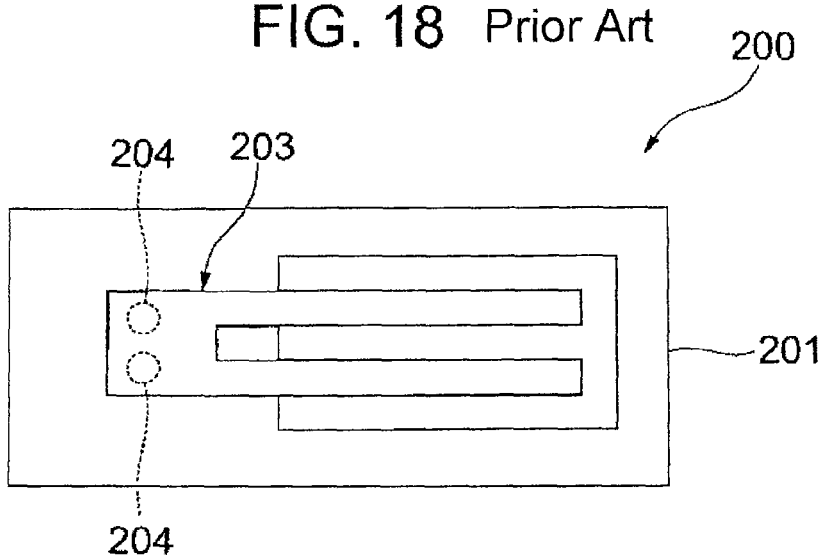
FIG. 18 is a view showing the internal structure of a piezoelectric vibrator in the related art, and is a view showing a piezoelectric vibrating reed from the upper side when a lid substrate is removed.
Figure 19:
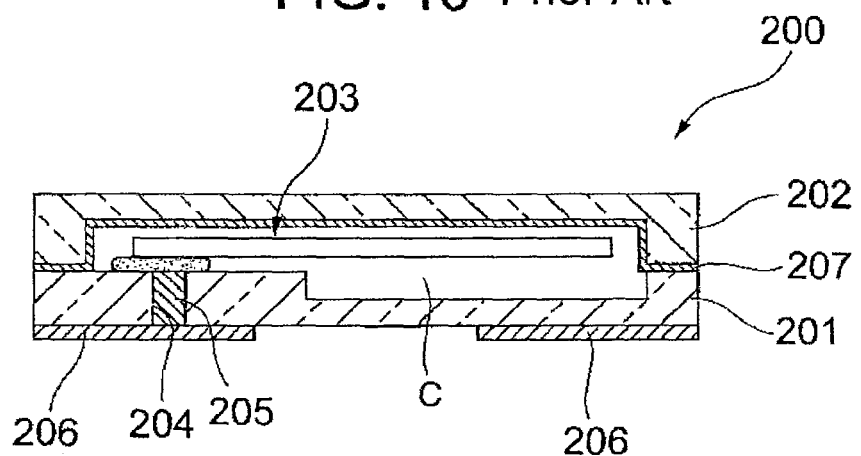
FIG. 19 is a cross-sectional view of the piezoelectric vibrator shown in FIG. 18.
Figure 20:
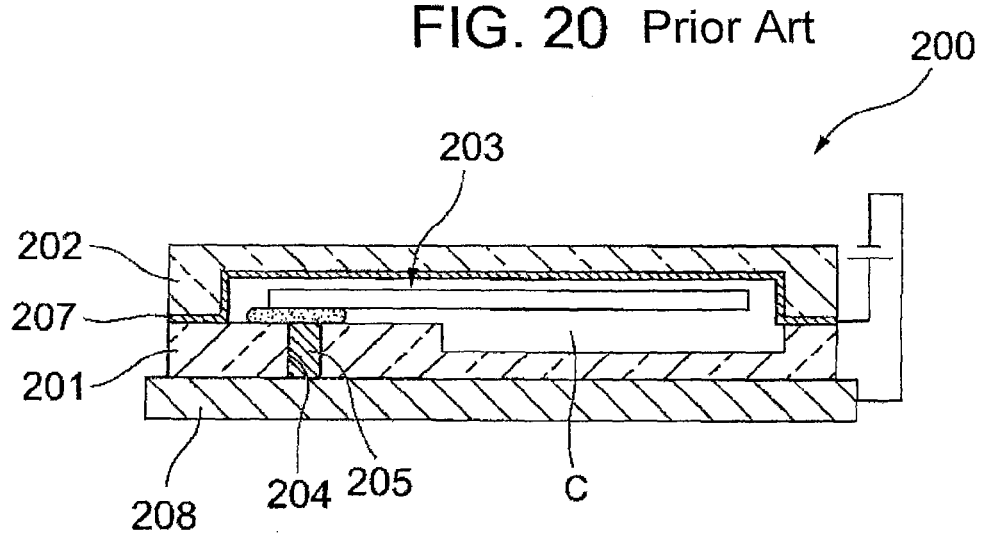
FIG. 20 is a view illustrating one process when the piezoelectric vibrator shown in FIG. 18 is manufactured, and is a view showing that the base substrate and the lid substrate, which are superimposed, are set on an electrode plate and a predetermined voltage is applied to a bonding film and the electrode plate.

As shown in FIG. 17, a radio clock 130 according to this embodiment includes the piezoelectric vibrator 1 that is electrically connected to a filter unit 131. The radio clock is a clock that has a function of receiving standard waves including clock information, a function of automatically correcting the standard waves at a correct time, and a function of displaying the standard waves.

In Japan, transmission stations (transmitter station) for transmitting standard waves are located in Fukushima-ken (40 kHz) and Saga-ken (60 kHz) and transmit standard waves. A long wave corresponding to 40 kHz or 60 kHz has a property of propagating on the surface of the ground and a property of propagating while the long wave is reflected from an ionization layer and the surface of the ground. Accordingly, the propagation range of the long wave is wide, and the above-mentioned two transmission stations cover the entire area of Japan.

The functional structure of the radio clock 130 will be described in detail below.

An antenna 132 receives standard waves that are long waves corresponding to 40 kHz or 60 kHz. The standard wave, which is a long wave, is a wave that is obtained by performing AM modulation of time information, which is called time codes, in a carrier wave corresponding to 40 kHz or 60 kHz. The reception standard wave, which is a long wave, is amplified by the amplifier 133, and is filtered and synchronized by the filter unit 131 including a plurality of piezoelectric vibrators 1.

The piezoelectric vibrators 1 of this embodiment include crystal vibrator parts 138 and 139 having resonant frequencies of 40 kHz and 60 kHz, which are equal to the carrier frequencies, respectively.

Further, the filtered signal having a predetermined frequency is detected and demodulated by a detection/rectification circuit 134. Subsequently, the time codes are extracted through a wave-shaping circuit 135, and are counted by a CPU 136. The CPU 136 reads out information, such as the current year, accumulated days, a day of the week, and time. The read information is reflected in the RTC 137, so that correct time information is displayed.

Since the carrier wave corresponds to 40 kHz or 60 kHz, a vibrator having the above-mentioned tuning-fork type structure is preferably used as each of the crystal vibrator parts 138 and 139.

Meanwhile, the case of Japan has been exemplified above, but the frequency of the standard wave, which is a long wave, varies abroad. For example, a standard wave corresponding to 77.5 KHz is used in Germany. Accordingly, when a radio clock 130, which can be used even abroad, is to be built in a portable device, there is needed a piezoelectric vibrator 1 having a frequency different from a frequency of the case of Japan.

As described above, the radio clock 130 according to this embodiment includes the high-quality piezoelectric vibrator 1 that has reliable airtightness in the cavity C and secures stable electric conductivity between the piezoelectric vibrating reed 4 and the external electrodes 38 and 39. Accordingly, likewise, it may also be possible to improve the quality of the radio clock. In addition to this, it may be possible to count a stable and accurate frequency time over a long period of time.

Meanwhile, the technical scope of the invention is not limited to the above-mentioned embodiments, and various modifications may be made to the invention without departing from the scope of the invention.

For example, in the above-mentioned embodiment, a grooved piezoelectric vibrating reed 4 where the groove portions 18 are formed on both surfaces of the vibration arm portions 10 and 11 has been described as an example of the piezoelectric vibrating reed 4. Meanwhile, a piezoelectric vibrating reed without the groove portions 18 may be used. However, if the groove portions 18 are formed, it may be possible to improve electric field efficiency between the pair of excitation electrodes 15 when a predetermined voltage is applied to the pair of excitation electrodes 15. Accordingly, it may be possible to further suppress vibration loss and to further improve vibration characteristics. That is, it may be possible to further lower a CI value (crystal Impedance) and to further improve the performance of the piezoelectric vibrating reed 4. In this regard, it is preferable to form the groove portions 18.

Further, the tuning-fork type piezoelectric vibrating reed 4 has been exemplified in the above-mentioned embodiment, but the piezoelectric vibrating reed is not limited to a tuning-fork type piezoelectric vibrating reed. For example, a thickness-shear vibrating reed may be used.

Furthermore, in the above-mentioned embodiment, a vibration gap of the pair of vibration arm portions 10 and 11 of the piezoelectric vibrating reed 4 has been secured by forming the recess 2a on the base substrate 2. However, the invention is not limited thereto. For example, the recess 2a is not formed, and bumps may be formed on the routing electrodes 36 and 37 so that bump bonding is performed. According to the bump bonding, it may be possible to make the piezoelectric vibrating reed 4 float from the upper surface of the base substrate 2 and to naturally secure a minimum vibration gap that is required for vibration.

Further, a glass material, which is the same material as the material of the base substrate wafer 40, is used as the material of the dummy member R in this embodiment, but the material of the dummy member is not limited thereto. As long as the dummy member R is made of a material in which ions can be transferred at a bonding temperature, the dummy member may be made of any material.

However, it is preferable that the dummy member R be made of a material having a coefficient of thermal expansion substantially equal to the coefficient of thermal expansion of the base substrate wafer 40 like the material used in the above-mentioned embodiment. According to this, the base substrate wafer 40 and the dummy member R thermally expand to the same degree as described above, so that it may be possible to further improve the quality of the piezoelectric vibrator 1.

Further, it is preferable that the dummy member R be made of anodically bondable glass. Anodically bondable glass has an insulating property in a normal condition. However, when the anodically bondable glass is heated to the bonding temperature, ions are actively transferred in the anodically bondable glass. For this reason, the anodically bondable glass can secure appropriate electric conductivity together with the base substrate wafer 40 in the bonding process.

The invention claimed is:

1. A method for producing piezoelectric vibrators, comprising:
    (a) defining a plurality of first substrates on a first wafer and a plurality of second substrates on a second wafer;
    (b) forming a pair of penetration electrodes through respective at least some of the first substrates on the first wafer;
    (c) layering the first and second wafers such that at least some of the first substrates substantially coincide respectively with at least some of the corresponding second substrates, with a bonding film sandwiched between the first and second substrates in respective pairs of at least some of coinciding first and second substrates, wherein a piezoelectric vibrating strip is secured in respective pairs of the at least some of coinciding first and second substrates;
    (d) placing, on a base plate, the first wafer layered with the second wafer, with an intermediate plate placed between the base plate and the first wafer, wherein the intermediate plate is made of a material in which inner ions are movable at a bonding temperature;
    (e) applying, at the bonding temperature, a bonding voltage across the base plate and respective at least some of the bonding films to anodically bond the first and second substrates of the at least some of the respective pairs of the coinciding first and second substrates.

2. The method according to claim 1, wherein the intermediate plate is made of a material having a thermal expansion coefficient substantially equal to that of the first wafer.

* * * * *